United States Patent [19]
Creek

[11] Patent Number: 6,052,810
[45] Date of Patent: Apr. 18, 2000

[54] DIFFERENTIAL DRIVER CIRCUIT FOR USE IN AUTOMATIC TEST EQUIPMENT

[75] Inventor: William Creek, Fremont, Calif.

[73] Assignee: LTX Corporation, Westwood, Mass.

[21] Appl. No.: 09/111,416

[22] Filed: Jul. 7, 1998

[51] Int. Cl.[7] .............................. G06F 11/00; G01R 31/28
[52] U.S. Cl. .......................... 714/740; 714/724; 324/763
[58] Field of Search .................................... 714/738, 740, 714/742, 733, 734; 324/512, 527, 763

[56] References Cited

U.S. PATENT DOCUMENTS

| | | | |
|---|---|---|---|
| 4,439,858 | 3/1984 | Petersen | 714/734 |
| 4,791,358 | 12/1988 | Sauerwald et al. | 324/73.1 |
| 5,875,198 | 2/1999 | Satoh | 714/740 |

OTHER PUBLICATIONS

Gillete, Garry C., A Single Board Test System: Changing the Test Paradigm, IEEE (1995), Paper 37.2, pp. 880–885.

*Primary Examiner*—Trinh L. Tu
*Attorney, Agent, or Firm*—Blakely, Sokoloff, Taylor & Zafman LLP

[57] ABSTRACT

A tester circuit generating differential signals, single ended signals, or a fast transitioning signal to exercise inputs of a device under test is described. According to one embodiment, the tester circuit includes a first circuit configured to generate a first test signal on an input of the first driver. The tester circuit also includes a second circuit configured to generate a second test signal on an input of a second driver. Further, the tester circuit also includes select signals and select logic to determine the different testing modes of the device under test.

19 Claims, 6 Drawing Sheets

FIG. 6

DIFFERENTIAL DRIVER CIRCUIT FOR USE IN AUTOMATIC TEST EQUIPMENT

FIELD OF THE INVENTION

The present invention relates to an automatic tester. More particularly, the present invention relates to a differential driver circuit included in an automatic tester that generates differential signals, multiple single ended signals, or a high speed signal to test the input pins of a device under test.

BACKGROUND

Test equipment is typically used to determine whether a device under test ("DUT") follows a set of timing specifications. Accordingly, timing accuracy plays a vital role in the design of test equipment because a discrepancy in the timing accuracy can result in an incorrect classification of a DUT. For example, in some testing environments, provided a DUT follows a set of predetermined timing specifications, the DUT is categorized as a valid device for sale. Typically to pass as a valid device, each pin of a given DUT must satisfy timing requirements such as valid time, hold time, and setup time. These timing requirements, however, are susceptible to both electrical noise and transmission noise.

To counteract the effect of noise, conventional testers add a guardband to timing measurements. The timing guardband ensures that pin timings are not a product of noise. One disadvantage of adding a guardband results in the testing equipment failing valid devices. In particular, the guardband makes the timing specification more stringent, thus DUTs that pass the timing specification but fail the guardband requirements are classified as failing devices.

Figure 1:
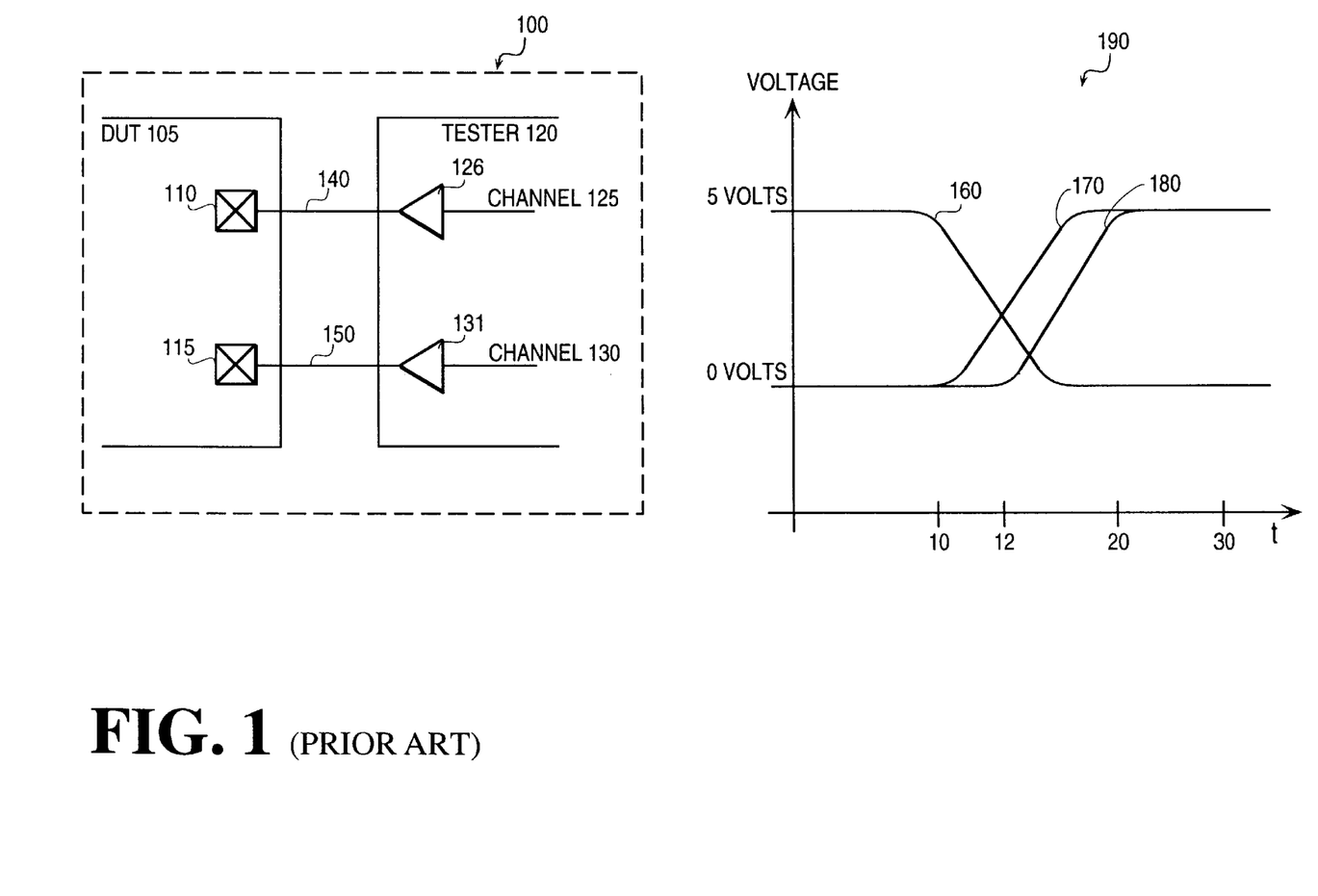
FIG. 1 illustrates a prior art testing system and timing chart of a differential signal generated by the testing system.

FIG. 1 illustrates a prior art testing system. In particular, test system 100 comprises tester 120 coupled to a device under test (105). Tester 120 includes two logic paths, denoted as channel 125 and channel 130, that generate test vectors along signal lines 140 and 150. Typically, each logic path is coupled to a unique driver. For example, as illustrated in FIG. 1, channel 125 is coupled to driver 126 and channel 130 is coupled to driver 131.

Using drivers 126 and 131, tester 120 places different voltages on DUT 105's input pads (110 and 115). For example, DUT 105 realizes a logic "1" value as 5 volts and a logic "0" value as 0 volts. Accordingly, to drive pad 110 to a logic "1" value, driver 126 must drive 5 volts on line 140. Similarly, to drive pad 115 to a logic "0" value, driver 131 must drive 0 volts on line 150. Thus, by varying the voltage values on line 140 and line 150, tester 120 is able to exercise the inputs of DUT 105 and determine whether DUT 105's inputs satisfy a set of timing specifications. Provided each of DUT 105's inputs are coupled to independent logic circuits, tester 120 allows for an accurate measurement of DUT 105's input timings.

In high speed applications, however, to counteract the effects of noise some devices include inputs coupled to differential circuits. Typically a pair of differential inputs are coupled to a differential amplifier and the differential inputs are used to realize the logic value of a given input. Differential inputs are used in high speed applications because a voltage measurement based on the difference in the value between a pair of differential inputs is less susceptible to electrical noise and transmission line reflections. Conventional testers, however, have numerous disadvantages when used in conjunction with the differential inputs of a DUT.

One disadvantage of using conventional tester with differential inputs results in matching the rise time and fall time of a tester generated differential input. In particular, as the testing frequency increases, jitter in the tester's drivers results in a misalignment of the tester generated differential inputs. Typically, jitter in a tester's driver is created by power spikes, cross-talk between different components of the driver, and different delay paths between the differential signals. Additionally, possible timing errors between the tester's independent channels may add to the misalignment of the tester generated differential input. The misalignment between rise and fall times of the tester generated differential input results in an inaccurate characterization of the DUT.

FIG. 1 also illustrates the misalignment between rise and fall times when tester 120 is used to generate a differential input. The horizontal axis of timing chart 190 shows time ("t"). The vertical axis of timing chart 190 shows the voltage level on pads 110 and 115. In particular, signal 160 denotes the voltage level on pad 115 and signal 170 denotes the voltage level on pad 110. Provided, tester 120 operates at a low frequency without noise on tester 120 outputs, signals 160 and 170 intersect at time 10. Accordingly, DUT 105's inputs are exercised at time 10.

As previously described, however, during the testing of high speed devices tester 120 is susceptible to noise. For example, in high frequency applications jitter and/or channel timing errors results in the shift of signal 170. Signal 180 illustrates a possible shift of signal 170. Accordingly, the intersection between the high-to-low transition of signal 160 and the low-to-high transition of signal 180 occurs at time 12. Thus, DUT 105's inputs are exercised at time 12 resulting in the inaccurate testing of DUT 105. In particular, a test system 100 that expects an output transition based on an input transition at time 10 will incorrectly determine that DUT 105 does not follow timing specifications. To counteract the rise and fall time misalignments in tester generated differential signal some prior art system add a guardband to the timing requirement. As previously described, however, adding a guardband makes the timing specification more stringent, thus leading to the incorrect classification of some DUTs.

SUMMARY OF THE INVENTION

A tester circuit operable to generate a plurality of test signals is described. The test circuit comprises a first circuit coupled between a first input and a first driver. The first circuit is configured to generate a first test signal on an input of the first driver. The test circuit also comprises a second circuit coupled between a second input and a second driver. The second circuit is configured to generate a second test signal on an input of the second driver. Furthermore, the test circuit comprises a first select circuit having a first select signal. The first select circuit is coupled to the first circuit and the second circuit. The first select circuit is configured to selectively couple the first input to both the first circuit and the second circuit based on the first select signal having a first value.

Other objects, features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

A test circuit comprising a differential driver circuit with multiple operational modes is disclosed. The test circuit provides a high accuracy testing system that allows the generation of a high speed differential signal, a pair of high speed non-differential signal, a fast transitioning single signal, or a low impedance driver for highly capacitive loads. For one embodiment, devices examined by the test circuit include integrated circuits used in telecommunication applications and high speed microprocessors. For an alternative embodiment, the test circuit is also used to drive a high capacitive input such as the clock input of an integrated circuit.

An intended advantage of an embodiment of the invention is to provide a high bandwidth test circuit that provides accurate testing of a DUT's differential inputs. The test circuit includes circuitry that allows the test circuit to drive a pair of differential inputs or two independent pin electronic channels.

Another intended advantage of an embodiment of the invention is to provide symmetrical transitioning differential signals. In particular, a differential driver with low skew and jitter between a pair of generated differential signals is disclosed.

Yet another intended advantage of an embodiment of the invention is to provide a test circuit that generates a fast transitioning signal on an input of a DUT. In particular, the fast transitioning signal operates at a data rate that is twice the operating frequency of the tester circuit. Still yet another intended advantage of an embodiment of the invention is to provide a test circuit that may be used to test highly loaded inputs on a DUT.

Figure 2:
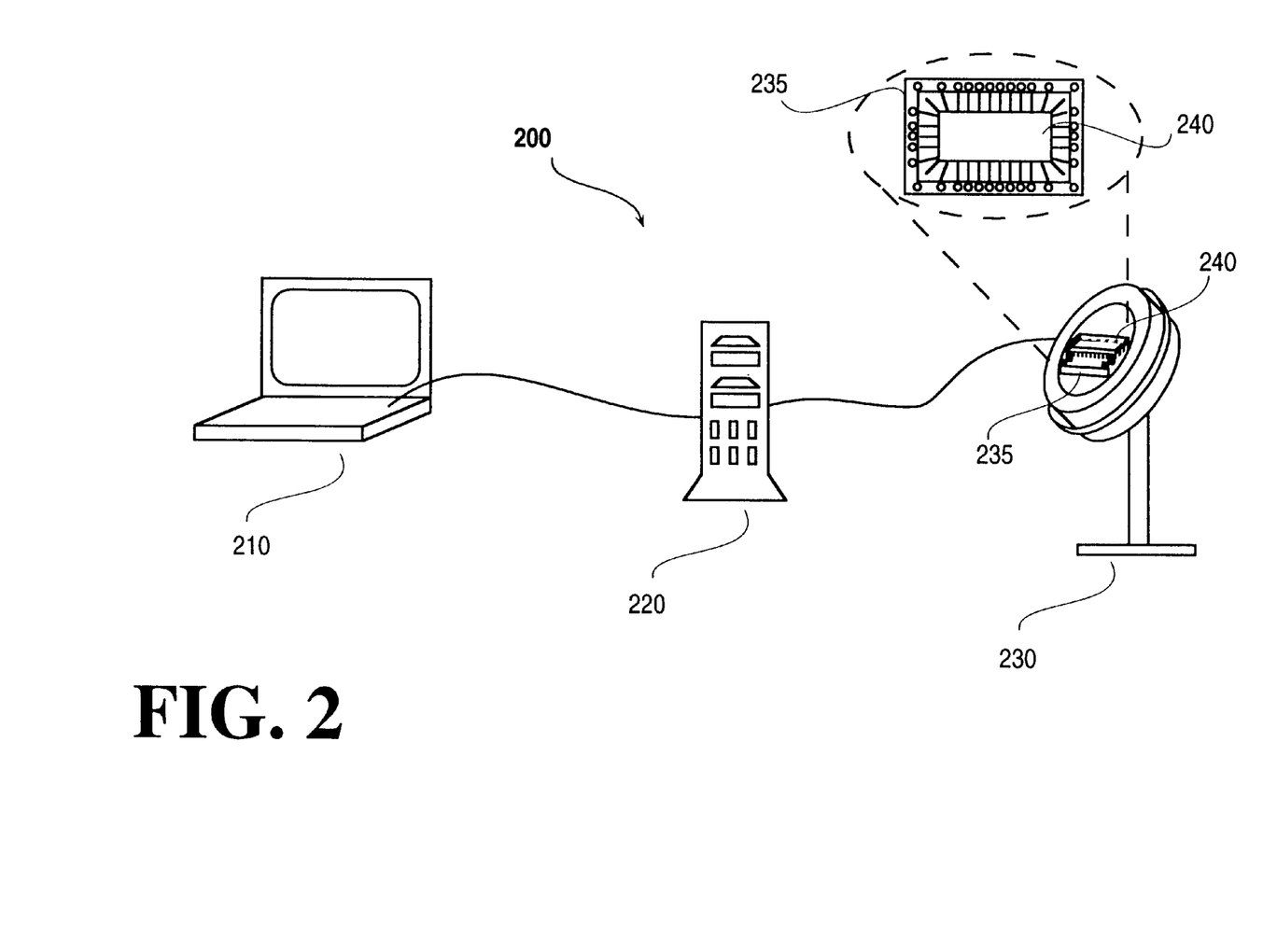
FIG. 2 shows one embodiment of a test circuit system.

FIG. 2 shows one embodiment of a test circuit system. In particular, test system 200 shows computer 210 coupled to diagnostic system 220. Diagnostic system 220, in turn, is coupled to testing base 230. Testing base 230 is used to orient and couple the pins of device under test ("DUT") 240 to interface circuit 235. As illustrated in FIG. 2, testing base 230 provides a platform that allows interface circuit 235 to directly connect to the pins of DUT 240. For one embodiment, interface circuit 235 includes two components. The first component includes drive circuits (not shown) used to drive DUT 240's input pins. The second components includes offsettable differential comparators (not shown) used to read DUT 240's output pins. Using interface circuit 230, test system 200 determines the input/output ("I/O") characteristics of DUT 240.

For one embodiment, computer 210 generates test vectors. The test vectors include a set of inputs used to exercise the logic included in DUT 240. The test vectors also include a set of expected outputs. The excepted outputs represent a desired output based on selected input values. Using the test vectors, test system 200 examines the I/O characteristics of DUT 240. In particular, diagnostic system 220 calibrates the input test vectors, via interface circuit 235, and applies the calibrated input signals to the input pins of DUT 240. Diagnostic system 220 also reads the output pins of DUT 240 via interface circuit 235. Subsequent to reading the DUT's output values, diagnostic system 220 compares the values on the output pins to the excepted vector outputs.

For a given set of inputs, system 200 compares the values generated by DUT 240 versus the expected outputs during a given time period. Accordingly, system 200 determines the timing specification of DUT 240's inputs. For one embodiment, DUT 240 comprises a digital microprocessor. For alternative embodiments DUT 240 comprises mixed signal communication integrated circuits.

For one embodiment, test system 200 is coupled to a DUT with differential inputs. Accordingly, interface circuit 235 includes a differential driver circuit that generates a differential input—i.e., a signal and the signal's inverse. Each differential input of the DUT is coupled to a single differential driver circuit. For an alternative embodiment, multiple differential inputs of the DUT are coupled to a single differential driver circuit thorough a multiplexing device that selects a particular DUT input for testing. Using the differential driver circuit, test system 200 exercises the timing specifications of the DUT's differential inputs. For yet another embodiment, the differential driver circuit is used to generate a fast transitioning input on a single input of the DUT. For yet another embodiment, the differential driver circuit is used to generate multiple single ended inputs.

Figure 3:
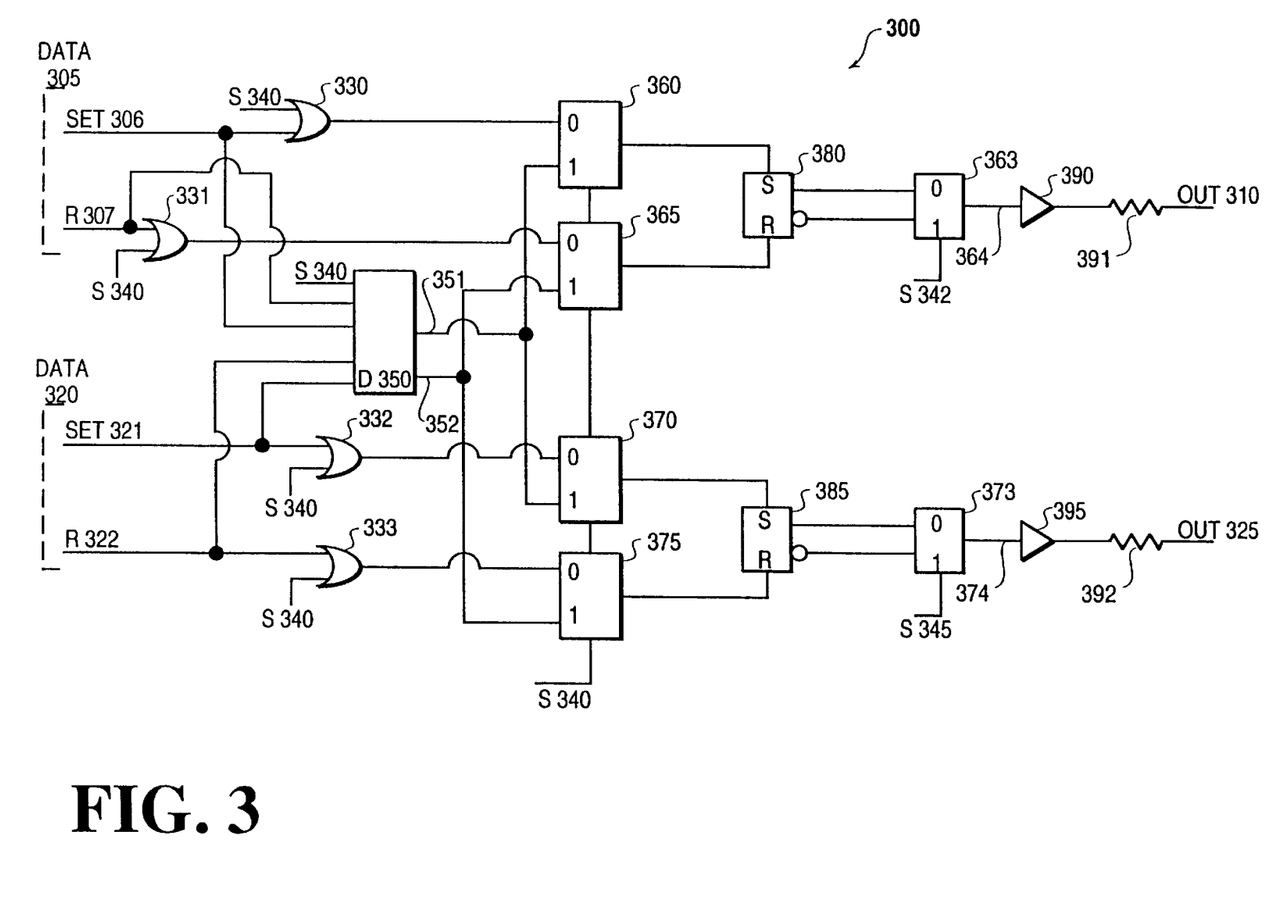
FIG. 3 shows one embodiment of a differential driver circuit.

FIG. 3 shows one embodiment of a differential driver circuit. In particular, circuit 300 includes logic or-gates (330–333), a select logic (D350), switches (360, 363, 365, 370, 373, and 375), latches (380 and 385), resistors (391 and 392), and drivers (390 and 395). Circuit 300 also includes two inputs (Data 305 and Data 320), two outputs (output 310 and output 325), and three select signals (S340, S342, and S345). For one embodiment, switches 360, 363, 365, 370, 373, and 375 comprise two-to-one multiplexors. For an alternative embodiment, latches 380 and 385 comprise set/reset latches. For another embodiment, circuit 300 is used in an automatic tester operating up to 500 Megahertz ("Mhz"). Accordingly, latches 380 and 385 include clocking circuitry (not shown) that synchronizes circuit 300's outputs (output 310 and output 325) up to one giga-hertz. For yet another embodiment, all similar devices in circuit 300 have matching sizes, matching physical layouts, and are located on the same integrated circuit, thus resulting in a similar propagation delay between signal paths from data 305 to output 310 and data 320 to output 325.

Input data 305 includes two inputs S306 and R307. S306 is coupled to an input of or-gate 330 and logic D350. Or-gate 330's second input is coupled to S340 and or-gate 330's output is coupled to a first input of switch 360. The second input of switch 360 is coupled to an output of logic D350 along line 351. Based on the value of S340, switch 360 selects between or-gate 330's output and line 351. Switch 360 couples the selected input to the set node of latch 380. R307 is also coupled to an input of an or-gate (331) and logic D350. The second input of or-gate 331 is coupled to S340. Or-gate 331 ensures that R307 has similar propagation delays to S306. The output of or-gate 331 is coupled to an input of switch 365. The second input of switch 365 is coupled to an output of logic D350 along line 352. Based on the value of S340, switch 365 selects between or-gate 330's output and line 351. Switch 360 couples the selected input to the reset node of latch 380. Accordingly, using S340 circuit 300 selectively couples data 305 or the output of logic block D350 to the set and reset nodes of latch 380.

Similarly, input data 320 includes two inputs S321 and R322. S321 is coupled to an input of or-gate 332 and logic block D350. Or-gate 332's second input is coupled to S340 and or-gate 332's output is coupled to a first input of switch 370. The second input of switch 370 is coupled to an output of logic D350 along line 351. Based on the value of S340, switch 370 selects between or-gate 332's output and line 351. Switch 375 couples the selected input to the set node of latch 385. R322 is also coupled to an input of an or-gate (333). The second input of or-gate 333 is coupled to S340. Or-gate 333 ensures that R322 has similar propagation delays to S321. The output of or-gate 333 is coupled to an input of switch 375. The second input of switch 375 is coupled to an output of logic D350 along line 352. Based on the value of S340, switch 375 selects between or-gate 332's output and line 352. Switch 375 couples the selected input to the reset node of latch 385. Accordingly, using S340 circuit 300 selectively couples data 320 or the output of logic block D350 to the set and reset nodes of latch 385.

As illustrated in FIG. 3, both latch 380 and latch 385 have differential outputs. Latch 380's outputs are coupled to switch 363. Based on the value of S342, switch 363 selectively couples one of latch 380's differential outputs to driver 390. Driver 390, in turn, drives a voltage on output 310 via resistor 391. Similarly, latch 385's outputs are coupled to switch 373. Based on the value of S345, switch 373 selectively couples one of latch 385's differential outputs to driver 395. Driver 395, in turn, drives a voltage on output 325 via resistor 392. For one embodiment, both resistor 391 and resistor 392 are 50 ohms. For an alternative embodiment, drivers 390 and 395 are complimentary metal-oxide semi-conductor ("CMOS") inverters.

Circuit 300 implement different operational modes by selectively coupling inputs data 305 and data 320 to different components via select signals S340, S342, and S345. For one embodiment, S340, S342, and S345 comprise low speed control bits used to select a specific operational mode. Accordingly, each select signals is set prior to testing and held to a logical value during a specific test. Using the select signals circuit 300 permits three different operational modes. The operational modes include generating two independent single ended signals, generating a differential signal with low skew and jitter, and generating a high speed signal.

For one embodiment, circuit 300 generates two independent single ended signals by setting S340 to a "0" value. Setting S340 to "0" results in two independent channels determining the value of circuit 300's outputs. In particular, setting S340 to "0" couples data 305 directly to the set/reset inputs of latch 380 because switches 360 and 365 select their respective "0" inputs. Similarly, setting S340 to "0" couples data 320 directly to the set/reset inputs of latch 385 because switches 370 and 375 select their respective "0" inputs. Accordingly, output 310 is only driven by data 305 and output 325 is only driven by data 320. The relationship between data 305/320 and output 310/325 is described below in the description accompanying FIG. 5.

Provided S340 is set to a "0" circuit 300 generates two independent single ended signals on output 310 and output 325. In conjunction with S340, S342 and S345 are used to determine the polarity of output 310 and output 325, respectively. In particular, S342 and S345 select between the positive and negative outputs of latches 380 and 385 via switches 363 and 373. For example, provided S340 is set to a "0" and S342 is set to a "1," the logical inverse of data 305 is driven on line 364. Provided S340 is set to a "0" and S342 is set to a "0," however, the logical equivalent of data 305 is driven on line 364.

For one embodiment, circuit 300 generates a differential signal by setting S340 to a "1," S342 to a "0," and S345 to a "1." Setting S340 to a "1" results in logic D350 transferring either data 305 or data 320 to the set/reset nodes of latch 380 and latch 385. As illustrated in FIG. 3, D350 transfers one of the inputs to latch 380 and latch 385 via the "1" input of switches 360, 365, 370, and 375. The transferred input remains the same on line 364 and is inverted on line 374 because S342 is set to a "0," and S345 is set to a "1." Accordingly, a differential signal is generated on output 310 and output 325.

Circuit 300 also reduces skew and jitter for on a generated differential signal. In particular, setting S340 to "1" also results in or-gates 330 and 332 generating a zero voltage value on the "0" input of switches 360 and 370. The zero voltage value reduces noise between the "0" inputs of switches 360 and 370 and the input transferred by D350, thus reducing jitter and skew on the generated differential signal. Additionally, D350 only transfers a single input to both latch 380 and latch 385, thus the delay between latch 380's output on lines 364 and latch 385's output on line 374 is matched. Lines 364 and 367 generate the differential signal via drivers 390 and 395. Removing the delay between latch 380 and latch 385 outputs reduces the skew between the transiting edges of the generated differential signal. Furthermore, as previously described, circuit 300's components have matching sizes, matching physical layouts, and are located on the same integrated circuit. Accordingly, the propagation delay from circuit 300's inputs to the inputs of latch 380 and 385 are matched. Thus, further reducing the skew between the transiting edges of the generated differential signal. In the present embodiment, S342 is set to a "0" and S345 is set to a "1." Accordingly, output 310 is the logical equivalent of the input selected by D350 and output 325 is the inverse of output 310. For an alternative embodiment, S342 is set to a "1" and S345 is set to a "0." Accordingly, output 325 is the logical equivalent of the input selected by D350 and output 310 is the inverse of output 325.

For another embodiment, circuit 300 generates a fast transitioning signal by setting S340 to a "1," S342 to a "0," and S345 to a "0." Setting S340 to a "1" results in logic D350 transferring both data 305 and data 320 to the set/reset nodes of latch 380 and latch 385. For one embodiment, data 305 and data 320 are offset by a half cycle. Accordingly, circuit 300 generates output signals that transition at twice the frequency of inputs data 305 and data 320. The double frequency relationship between data 305/320 and output 310/325 is described below in the description accompanying FIG. 6. For an alternative embodiment, one of circuit 300 inputs are held to a constant value while the remaining input transitions according to a predetermined test pattern. Accordingly, D350 transfers the transitioning input to latch 380 and latch 385 via the "1" input of switches 360, 365, 370, and 375. The transferred input remains the same on lines 364 and 374 because both S342 and S345 are set to a "0." Accordingly, the same signal is generated on output 310 and output 325. Provided output 310 and output 325 are coupled to the same input of a DUT, circuit 300 generates a strongly driven input signal, via a 25 ohm resistance, on the DUT's input.

For one embodiment, circuit 300 is used in the drive circuit of test system 200. Accordingly, input test vectors are passed to data 305 and data 320. Data 305 and data 320, in turn, generate DUT 240's input signals via drivers 390 and 395. Circuit 300's different operational modes allow test system 200 to exercise the timing requirements for different pin definitions of DUT 240. In particular, using select signals S340, S342, and S345, circuit 300 may be configured to test DUT 240's differential inputs, single ended inputs, or highly capacitive inputs—for example, a clock input. Additionally, circuit 300 provides a differential signal with low skew and jitter, thus allowing the accurate testing of a DUT 240's differential inputs. For one embodiment, the high speed signal transitions at twice the operating frequency of test system 300.

Figure 4:
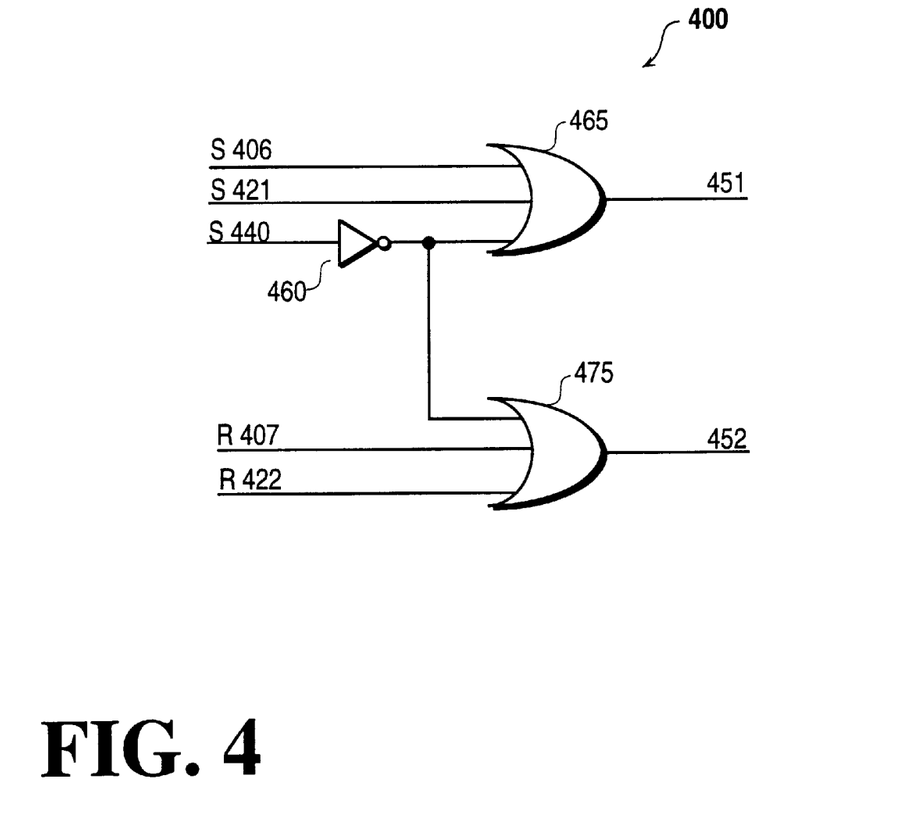
FIG. 4 shows one embodiment of a logic block included in a differential driver circuit.

FIG. 4 shows one embodiment of select logic D350 included in circuit 300. In particular, circuit 400 includes five inputs (S440, S406, S421, R407, and R422) and two outputs (451 and 452). Each of circuit 400 inputs/outputs correspond to a signal line in circuit 300. Specifically, S440, S406, R407, S421, and R422 are coupled to S340, S306, R307, S321, and R322, respectively. Further, outputs 451 and 452 are coupled to line 351 and 352, respectively.

As illustrated in FIG. 4, S440 is coupled to inverter 460. Inverter 460 is coupled to the first input of or-gate 465 and the first input of or-gate 475. S406 is coupled to the second input of or-gate 465 and S421 is coupled to the third input of or-gate 465. Or-gate 465 generates output 451. The last two inputs of circuit 400, R407 and R422, are coupled to the second and third inputs of or-gate 475, respectively. As further illustrated in FIG. 4, the output of or-gate 475 is coupled to output 452.

As previously described, provided S340 is set to "0," circuit 300 generates two independent signals on output 310 and 325 by bypassing circuit 400 (D350). S340 is coupled to S440. Accordingly, provided S340 is set to "0," the "1" input of switches 360 and 370 remain at a stable voltage value because inverter 460 generates a five voltage value on line 451. The stable voltage value reduces noise between the "1" inputs of switches 360 and 375 and the data inputs transferred by circuit 300. Thus, reducing jitter and skew on the generated differential signal.

Provided S340 is set to a "1," however, circuit 400 (D350) allows circuit 300 to selectively couple both data 305 and data 320 to latches 380 and 385. For example, for one embodiment, S340 is set to a "1," data 320 is held to a "0" value, and data 305 transitions based on test vectors applied to circuit 300. Accordingly, S421 and R422 have a "0" value while S406 and R407 transition following the value of data 305. Subsequently, both latches 380 and 385 generate signals on lines 364 and 374 from the same data, thus allowing circuit 300 to generate a differential signal with a reduced skew between the transiting edges of the generated differential signal. For an alternative embodiment, a select signal and circuitry (not shown) is included in circuit 400 to determine whether input data 305 or data 320 is used to generate the differential signal.

Figure 5:
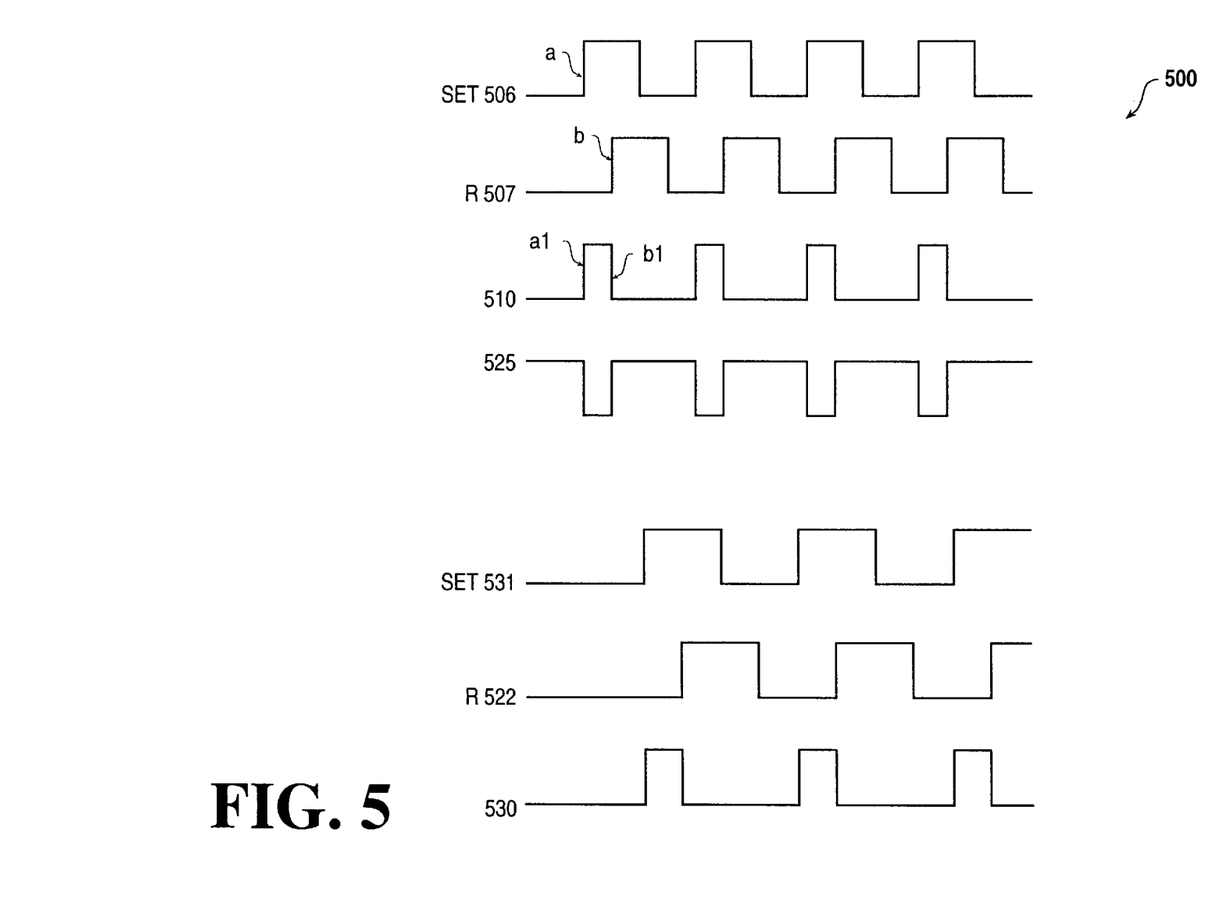
FIG. 5 shows one embodiment of a timing chart illustrating the relation between set, reset and a data output of during the generation of a differential signal.

FIG. 5 shows one embodiment of a timing chart illustrating the relation between set, reset and a data output of a differential driver circuit. In particular, timing chart 500 includes input signals (set 506, set 531, R507, and R522) and output signals (510, 525, and 530) operating in a 0 to 5 voltage range. For one embodiment, circuit 300 is operating in the differential mode and input signals set 506 and R507 are applied to circuit 300's S306 and R307 inputs, respectively. Accordingly, signals 510 and 525 show the timing wave-form of circuit 300's outputs output 310 and output 325.

The timing of circuit 300's outputs is determined by inputs set 506 and R507. In particular, as previously described, during the differential operation mode, S340 is set to "1" and the inputs to circuit 300, signals set 506 and R507, are applied directly to both latches 380 and 385. Input set 506 is applied to the set nodes of both latches 380 and 385. Similarly, input R507 is applied to the reset nodes of both latches 380 and 385.

As illustrated in FIG. 5, set 506 transitions to 5 volts at point "a," resulting in the setting of latches 380 and 385. Subsequently, R507 transitions to a 5 volts at point "b" resulting in the resetting of both latch 380 and latch 385. The setting of latch 380 results in circuit 300 generating a 5 volt signal 510 on output 310—that transition is denoted as "a1" in FIG. 5. The resetting of latch 380 results in circuit 300 generating a 0 volt signal 510 on output 310—that transition is denoted as "b1" in FIG. 5. As, illustrated in FIG. 5, the periodical setting/resetting of latch 380 results in signal 510.

For one embodiment, select signal S345 is set to a "1," accordingly, switch 373 select the inverse output of latch 385. Thus, circuit 300 generates signal 525 on output 325. Signal 510 is the inverse of signal 525, accordingly, circuit 300 generates a differential signal from the same inputs, set 506 and R507. The differential signal generated by circuit 300 has a reduced skew and jitter between the transiting edges of the generated differential signal because the same input signals are applied to both latches 380 and 385. Further, for one embodiment, all similar devices in circuit 300 have matching sizes, matching physical layouts, and are located on the same integrated circuit. Thus, the skew between 510 and 525 is reduced.

For an alternative embodiment, S340 is set to "0" and a second set of input signals (set 531 and R522) are applied to circuit 300 inputs, S312 and R322. Accordingly, circuit 300 generates waveform 510 on output 310. Circuit 300, however, generates waveform 530 on output 325. Accordingly, for the present embodiment, circuit 300 generates two independent single ended signals.

For one embodiment, circuit 300 is used in the drive circuit of test system 200. Accordingly, input test vectors are passed to circuit 300's data 305 and data 320 inputs. As illustrated in FIG. 5, circuit 300 uses the offset between the set and reset signals to generate accurate test signals. Accordingly, slow frequency vectors may be used to generate high frequency test signals. Additionally, test vectors with a fifty percent duty cycle may be used to generate test signals without a fifty percent duty cycle. For an alternative embodiment, the reset signal is an inverse of the set signal. Accordingly, only a single test vector is applied to each of circuit 300's inputs, data 305 and data 320.

Figure 6:
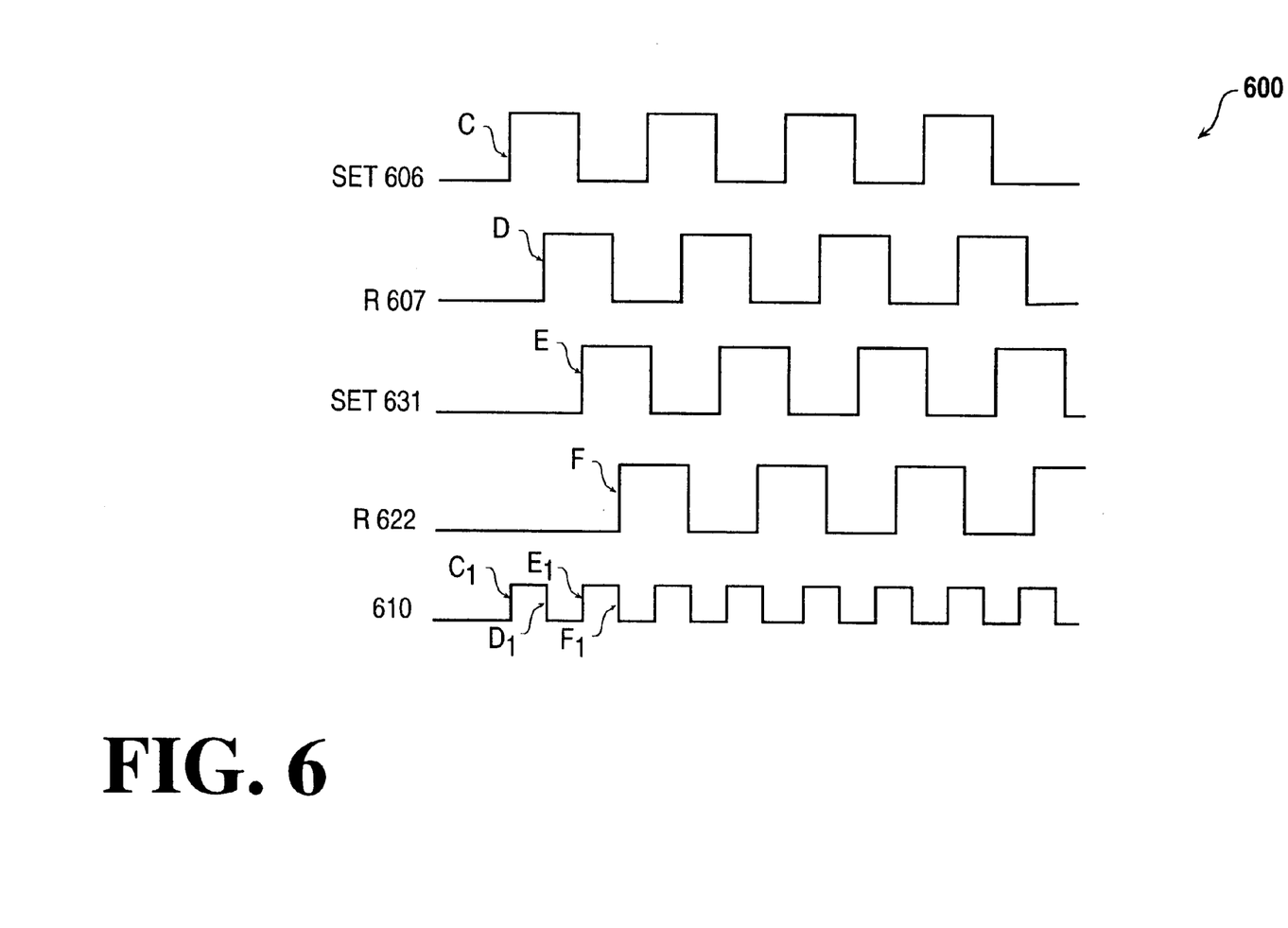
FIG. 6 shows one embodiment of a timing chart illustrating the relation between set, reset and a data output during the generation of a fast transitioning signal.

FIG. 6 shows one embodiment of a timing chart illustrating the relation between set, reset and a data output of a differential driver circuit. In particular, timing chart 600 includes input signals (set 606, set 631, R607, and R622) and an output signal (610) operating in a 0 to 5 voltage range. For one embodiment, circuit 300 is operating in a fast transitioning mode and signals set 606 and R607 are applied to circuit 300's S306 and R307 inputs, respectively. Similarly, signals set 631 and R622 are applied to circuit 300's S321 and R322 inputs, respectively. Accordingly, signal 610 illustrates the timing waveform of circuit 300's output 310.

The timing of circuit 300's outputs is determined by the overlap of inputs set 606, set 631, R607, and R622. In particular, as previously described, during the fast transitioning mode, S340 is set to "1," S342 to a "0," and S345 to a "0." Accordingly, signals set 606 and set 631, are applied directly to the set input of latch 380 and latch 385. Similarly, signals R 607 and R 622, are applied directly to the reset input of latch 380 and latch 385.

As illustrated in FIG. 6, set 606 transitions to 5 volts at point "c," resulting in the setting of latch 380. Subsequently, R 607 transitions to 5 volts at point "d" resulting in the resetting of latch 380. The setting and resetting of latch 380 results in circuit 300 generating signal 610 on output 310. Specifically, the setting of latch 380 results in circuit 300 generating a 5 volt signal 610 on output 310—denoted as "c1." Similarly, the resetting of latch 380 results in circuit 300 generating a 0 volt signal 610 on output 310—denotes as "d1."

Prior to set 606 and R 607 restarting their respective cycles, set 631 and R 622 also transition. As previously described, set 631 and R 622 are also coupled to the set and reset input of latch 380, respectively. Accordingly, the transition of set 631 and R 622 results in further transition in signal 610. In particular, set 631 transitions to 5 volts at point "e," resulting in the setting of latch 380. Subsequently, R 622 transitions to 5 volts at point "f" resulting in the resetting of latch 380. The setting and resetting of latch 380 results in circuit 300 generating signal 610 on output 310. Specifically, the setting of latch 380 results in circuit 300 generating a 5 volt signal 610 on output 310—denoted as "e1." Similarly, the resetting of latch 380 results in circuit 300 generating a 0 volt signal 610 on output 310—denoted as "f1." As, illustrated in FIG. 6, the periodical setting/resetting of latch 380 results in signal 610. Furthermore, overlapping different input signals allows circuit 300 to generate signals that operates at a higher frequency than the input signals.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A tester circuit operable to generate a plurality of test signals, the tester circuit comprising:
   a first circuit coupled between a first input and a first driver, the first circuit configured to generate a first test signal on an input of the first driver;
   a second circuit coupled between a second input and a second driver, the second circuit configured to generate a second test signal on an input of the second driver; and
   a first select circuit having a first select signal, the first select circuit coupled to the first circuit and the second circuit, wherein the first select circuit is configured to selectively couple the first input to both the first circuit and the second circuit based on the first select signal having a first value.

2. The tester circuit of claim 1, wherein the first test signal and the second test signal comprise two independent test signals based on the first select signal having a second value.

3. The tester circuit of claim 1, wherein the first circuit, the second circuit, and the first select circuit are located on a single integrated circuit.

4. The tester circuit of claim 1, the first circuit comprising a second select circuit and a second select signal, the select circuit configured to selectively couple an inverse of the first test signal on the input of the first driver based on the second select signal having a first value.

5. The tester circuit of claim 4, wherein the first test signal and the second test signal comprise a differential signal based on the first select signal having a first value and the second select signal having a first value.

6. The tester circuit of claim 5, the first and second circuit configured to have matching propagation properties.

7. The tester circuit of claim 6, the second select circuit comprising a multiplexing device.

8. The tester circuit of claim 4, wherein the first circuit comprises a set/reset latch coupled between the first input and the second select circuit, the set/reset latch generating the first test signal and an inverse of the first test signal.

9. The tester circuit claim 8, wherein the first input comprises a set signal and a reset signal, the set signal coupled to a set input of the set/reset latch and the reset signal coupled to a reset input of the set/reset latch.

10. A test system operable to examine differential inputs, single ended inputs, and high capacitive inputs of a device under test, the system comprising:
   a first driver coupled to a first input of the device under test;
   a second driver coupled to the second input of the device under test;
   a first circuit coupled between a first system input and the first driver, the first circuit configured to generate a first test signal on an input of the first driver based on a test vector applied to the first system input;
   a second circuit coupled between a second system input and the second driver, the second circuit configured to generate a second test signal on an input of the second driver based on the test vector applied to the second system input; and
   a first select circuit having a first select signal, the first select circuit coupled to the first circuit and the second circuit, wherein the first select circuit is configured to selectively couple the first system input to both the first circuit and the second circuit based on the first select signal having a first value.

11. The test system of claim 10, wherein the first test signal and the second test signal generate two single ended inputs based on the first select signal having a second value.

12. The test system circuit of claim 10, wherein the first test signal and the second test signal comprise the same signal based on the first select signal having a first value.

13. The test system of claim 12, wherein both the first driver and the second driver are coupled to the same input of the device under test.

14. The test system of claim 10, the first circuit comprising a second select circuit and a second select signal, the select circuit configured to selectively couple an inverse of the first test signal on the input of the first driver based on the second select signal having a first value.

15. The test system of claim 14, wherein the first test signal and the second test signal generate a differential signal based on the first select signal having a first value and the second select signal having a first value.

16. The test system of claim 15, wherein the first and second circuit are configured to have matching propagation properties.

17. The test system of claim 16, wherein the second select circuit comprises a multiplexing device.

18. The test system of claim 14, wherein the first circuit comprises a set/reset latch coupled between the first input and the second select circuit, the set/reset latch generating the first test signal and an inverse of the first test signal.

19. The test system of claim 18, wherein the first input comprises a set signal and a reset signal, the set signal coupled to a set input of the set/reset latch and the reset signal coupled to a reset input of the set/reset latch.

* * * * *